(12) United States Patent
Kondo (10) Patent No.: US 8,501,538 B2
(45) Date of Patent: Aug. 6, 2013

(54) METHOD FOR CONNECTING SUBSTRATE AND METHOD FOR MANUFACTURING SEMICONDUCTOR DEVICE

(75) Inventor: Manabu Kondo, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 14 days.

(21) Appl. No.: 13/350,129

(22) Filed: Jan. 13, 2012

(65) Prior Publication Data

US 2012/0190153 A1 Jul. 26, 2012

(30) Foreign Application Priority Data

Jan. 21, 2011 (JP) ................................ 2011-010582

(51) Int. Cl.
*H01L 21/44* (2006.01)
(52) U.S. Cl.
USPC ............................ 438/107; 438/109; 438/110
(58) Field of Classification Search
USPC ................. 438/107, 108, 109, 110, 111, 112, 438/118
See application file for complete search history.

(56) References Cited

U.S. PATENT DOCUMENTS

| | | | |
|---|---|---|---|
| 5,288,950 A | | 2/1994 | Ushio et al. |
| 6,210,993 B1 * | | 4/2001 | Farnworth et al. ............ 438/107 |
| 6,773,955 B2 * | | 8/2004 | Moden et al. ................. 438/106 |
| 7,348,492 B1 * | | 3/2008 | Kawai et al. .................. 174/254 |
| 7,589,412 B2 * | | 9/2009 | Kashimoto et al. ........... 257/693 |
| 2004/0209400 A1 * | | 10/2004 | Meyers ......................... 438/109 |
| 2006/0076158 A1 | | 4/2006 | Umeyama et al. |
| 2009/0090541 A1 * | | 4/2009 | Chia ............................. 174/254 |
| 2011/0057306 A1 * | | 3/2011 | McShane et al. ............. 257/706 |
| 2011/0210408 A1 | | 9/2011 | Otsuki |

FOREIGN PATENT DOCUMENTS

| | | |
|---|---|---|
| JP | A-5-267396 | 10/1993 |
| JP | A-5-327135 | 12/1993 |
| JP | A-2002-171031 | 6/2002 |
| JP | A-2005-292079 | 10/2005 |
| JP | A-2006-140452 | 6/2006 |
| JP | A-2011-179941 | 9/2011 |

* cited by examiner

*Primary Examiner* — Kevin M Picardat
(74) *Attorney, Agent, or Firm* — Oliff & Berridge, PLC (57) ABSTRACT

A method for connecting substrates is provided. The method includes the steps of: preparing a first wiring substrate having a first substrate including a first region and a second region which are provided with a first metal wire, wherein an area ratio between the first region and the first metal wires in the first region is different from an area ratio between the second region and the first metal wire in the second region; heating the first wiring substrate to bend the first wiring substrate; and electrically connecting a third wiring on a third substrate to the first metal wire provided on the first wiring substrate, thereby mounting the first wiring substrate on the third substrate in a manner that the first surface of the first substrate is nonparallel to the first surface of the third substrate.

9 Claims, 11 Drawing Sheets

METHOD FOR CONNECTING SUBSTRATE AND METHOD FOR MANUFACTURING SEMICONDUCTOR DEVICE

The entire disclosure of Japanese Patent Application No. 2011-010582, filed Jan. 21, 2011 is expressly incorporated by reference herein

BACKGROUND

1. Technical Field

The present invention relates to methods for connecting substrates and methods for manufacturing semiconductor devices.

2. Related Art

In recent years, electronic equipment often use FPC (Flexible Printed Circuit: Flexible substrate) as a method for electrically connecting electronic components to be provided on the electronic equipment. Amid advancing miniaturization of electronic equipment which require installation of electronic components in a small space, FPCs are more often used as electronic components can be laid out within a small space of electronic equipment while freely bending highly flexible FPCs. However, for further miniaturization of electronic equipment and application of FPCs to electronic devices, FPCs that can provide controllable bent shapes are in greater demand.

In this connection, Japanese Laid-open Patent Application 2002-171031 (Patent Document 1) proposes a FPC equipped with portions that can be readily bent, which are formed with a plurality of through holes, in other words, perforations, at bending portions in the FPC. Also, Japanese Laid-open Patent Application 2006-140452 (Patent Document 2) describes a structure to prevent a cover film from peeling from a resin base film, in which metal wires at bending portions are made thinner to increase bonding areas between the base film and the cover film, which uses the property of adhesive in which the adhesive force of the adhesive bonding the cover film to the resin base film is greater than to the metal wires.

However, both of the references Patent Documents 1 and 2 described above involve an independent bending step of bending a FPC, and pertain to readiness of bending the FPC and prevention of damage to the FPC. In particular, according to Patent Document 1, perforations need to be formed in advance in a FPC, which results in a longer manufacturing process, and thus a higher cost.

SUMMARY

In accordance with an aspect of embodiments of the invention, there is provided a method for connecting substrates together while bending an FPC, which does not require an independent step of bending a FPC.

The invention can be implemented by any one of the following embodiments and application examples to solve at least one of the problems described above.

APPLICATION EXAMPLE 1

A method for connecting substrates in accordance with Application Example 1 includes the steps of: preparing a first wiring substrate having a first substrate including a first surface, the first surface having a first region and a second region including a first metal wire located therein, wherein an area ratio between the first region and the first metal wire in the first region is different from an area ratio between the second region and the first metal wire in the second region; electrically bonding second metal wire on a second substrate to the first metal wire provided in the first region of the first wiring substrate; heating the first wiring substrate to bend the first wiring substrate between the first region and the second region; and electrically connecting a third wiring located in a first surface of a third substrate to the first metal wire provided in the second region of the first wiring substrate, thereby mounting the first wiring substrate on the third substrate in a manner that a portion or the entirety of the first surface of the first substrate is nonparallel to the first surface of the third substrate.

According to the application example described above, the area ratios of the first metal wire in the first region and in the second region of the first wiring substrate to the substrate are made different from each other, and heat is applied to the first wiring substrate, to cause a difference between the thermal expansion of the first wiring substrate in the first region and the thermal expansion of the first wiring substrate in the second region, thereby causing a flexural deformation near a boundary between the first region and the second region of the first wiring substrate. By the flexural deformation, a predetermined bent portion can be formed in the first wiring substrate by simply approximating the first wiring substrate together with the second substrate to the third substrate, for connecting the first wiring substrate connected to the second substrate to the third substrate. Accordingly, it is not necessary to provide in advance a step to form the first wiring substrate into a predetermined bent shape in a mounted state, and therefore a method for connecting substrates that streamlines the process and reduces the cost can be obtained.

APPLICATION EXAMPLE 2

A method for bonding substrates together in accordance with Application Example 2 includes the steps of: preparing a first wiring substrate that has a first metal wire located in a first surface of a first substrate and having a first portion and a second portion that has a narrower width than the first portion; heating the first wiring substrate to bend the first wiring substrate between the first portion and the second portion; electrically bonding a second metal wire on a second substrate to the first portion of the first wiring substrate; and electrically connecting a third wire located in a first surface of a third substrate to the second portion of the first metal wire, thereby mounting the first wiring substrate on the third substrate in a manner that a portion or the entirety of the first surface of the first substrate is nonparallel to the first surface of the third substrate.

According to the application example described above, the metal wire are made narrower in the second potion compared to the first portion of the first wiring substrate, and heat is applied to the first wiring substrate, to cause a difference between the thermal expansion of the first wiring substrate in the first portion and the thermal expansion of the first wiring substrate in the second portion, thereby causing a flexural deformation near a boundary between the first portion and the second portion of the first wiring substrate. By the flexural deformation, a predetermined bent portion can be formed in the first wiring substrate by simply approximating the first wiring substrate together with the second substrate to the third substrate, for connecting the first wiring substrate connected to the second substrate to the third substrate. Accordingly, it is not necessary to provide in advance a step to form the first wiring substrate into a predetermined bent shape required in a mounted state, and therefore a method for connecting substrates that can streamline the process and reduce the cost can be obtained.

APPLICATION EXAMPLE 3

In the application examples described above, the first substrate may be thicker than the first metal wiring.

According to the application example described above, by making the first frustrate having a greater thermal expansion thicker, compared to the metal wire having a smaller thermal expansion, a bent section occurring due to thermal deformation is securely generated, and the amount of flex is made greater to improve the connection property with respect to the third substrate.

APPLICATION EXAMPLE 4

In the application examples described above, the step of bending the first wiring substrate may include heating the first wiring substrate at temperatures between 150° C. and 250° C.

According to the application example described above, a bent section can be securely generated in the first wiring substrate.

APPLICATION EXAMPLE 5

In the application examples described above, the first portion and the second portion of the first metal wire may be connected by a third portion that continuously narrows from the first portion toward the second portion.

According to the application example described above, stress concentration in the metal wire at the bent section is alleviated, such that breakage of the metal wires can be prevented.

APPLICATION EXAMPLE 6

A method for manufacturing a semiconductor device in accordance with Application Example 6 includes the steps of: preparing a first wiring substrate having a first substrate including a first surface, the first surface having a first region and a second region including a first metal wire located therein, wherein an area ratio between the first region and the first metal wire in the first region is different from an area ratio between the second region and the first metal wire in the second region; electrically bonding a second metal wire on a second substrate to the first metal wire provided in the first region of the first wiring substrate; heating the first wiring substrate to bend the first wiring substrate between the first region and the second region; and electrically connecting a third wiring located in a first surface of a third substrate to the first metal wire provided in the second region of the first wiring substrate, thereby mounting the first wiring substrate on the third substrate in a manner that a portion or the entirety of the first surface of the first substrate is nonparallel to the first surface of the third substrate. The second substrate is a semiconductor chip.

According to the application example described above, the area ratios of the first metal wire in the first region and in the second region of the first wiring substrate to the substrate are made different from each other, and heat is applied to the first wiring substrate, to cause a difference between the thermal expansion of the first wiring substrate in the first region and the thermal expansion of the first wiring substrate in the second region, thereby causing a flexural deformation near a boundary between the first region and the second region of the first wiring substrate. By the flexural deformation, a predetermined bent portion can be formed in the first wiring substrate by simply approximating the first wiring substrate together with the semiconductor device to the third substrate, for connecting the first wiring substrate connected to the semiconductor device to the third substrate. Accordingly, it is not necessary to provide in advance a step to form the first wiring substrate into a predetermined bent shape required in a mounted state, and therefore a method for manufacturing a semiconductor device that can streamline the process and reduce the cost can be obtained.

APPLICATION EXAMPLE 7

A method for manufacturing a semiconductor device in accordance with Application Example 7 includes the steps of; preparing a first wiring substrate that a has first metal wire located in a first surface of a first substrate and including a first portion and a second portion having a narrower width than the first portion; heating the first wiring substrate to bend the first wiring substrate between the first portion and the second portion; electrically bonding a second metal wire on a second substrate to the first portion of the first wiring substrate; and electrically connecting a third wire located in a first surface of a third substrate to the second portion of the first metal wire, thereby mounting the first wiring substrate on the third substrate in a manner that a portion or the entirety of the first surface of the first substrate is nonparallel to the first surface of the third substrate. The second substrate is a semiconductor chip.

According to the method for manufacturing a semiconductor device in accordance with the application example described above, the metal wire is made narrower in the second potion compared to the first portion of the first wiring substrate, and heat is applied to the first wiring substrate, to cause a difference between the thermal expansion of the first wiring substrate in the first portion and the thermal expansion of the first wiring substrate in the second portion, thereby causing a flexural deformation near a boundary between the first portion and the second portion of the first wiring substrate. By the flexural deformation, a predetermined bent portion can be formed in the first wiring substrate by simply approximating the first wiring substrate together with the semiconductor element to the third substrate, for connecting the first wiring substrate connected to the semiconductor element to the third substrate. Accordingly, it is not necessary to provide in advance a step to form the first wiring substrate into a predetermined bent shape required in a mounted state, and therefore a method for manufacturing a semiconductor device that can streamline the process and reduce the cost can be obtained.

APPLICATION EXAMPLE 8

In the application example described above, the first substrate may be thicker than the first metal wiring.

According to the application example described above, by making the first frustrate having a greater thermal expansion thicker, compared to the metal wire having a smaller thermal expansion, generation of a bent section clue to thermal deformation is secured, and the amount of flex is made greater to improve the connection property with respect to the third substrate.

APPELLATION EXAMPLE 9

In the application example described above, the step of bending the first wiring substrate may include heating the first wiring substrate at temperatures between 150° C. and 250° C.

According to the application example described above, a bent section can be securely generated in the first wiring substrate.

APPLICATION EXAMPLE 10

In the application example described above, the first portion and the second portion of the first metal wire may be connected by a third portion that continuously narrows from the first portion toward the second portion.

According to the application example described above, stress concentration to the metal wire at the bent section is alleviated, such that breakage of the metal wires can be prevented.

DESCRIPTION OF EXEMPLARY EMBODIMENTS

Embodiments of the invention will be described below with reference to the accompanying drawings.

First Embodiment

Figure 1A:
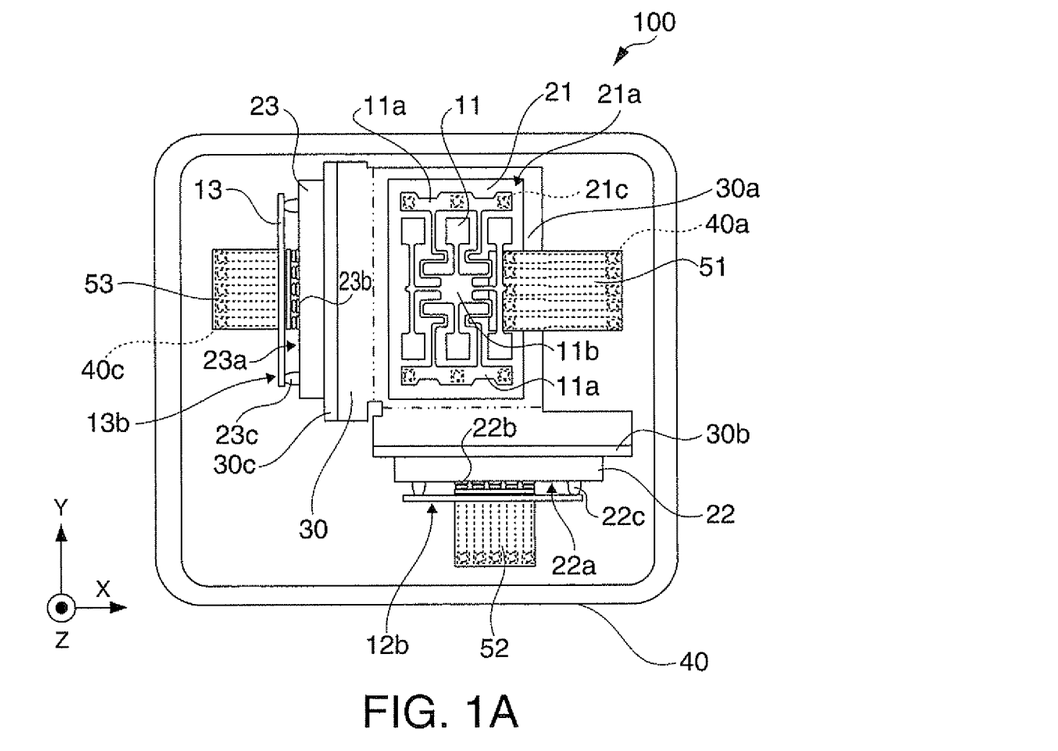
FIGS. 1A and 1B are respectively a plan view and a cross-sectional view of a semiconductor device in accordance with a first embodiment of the invention.
Figure 1B:
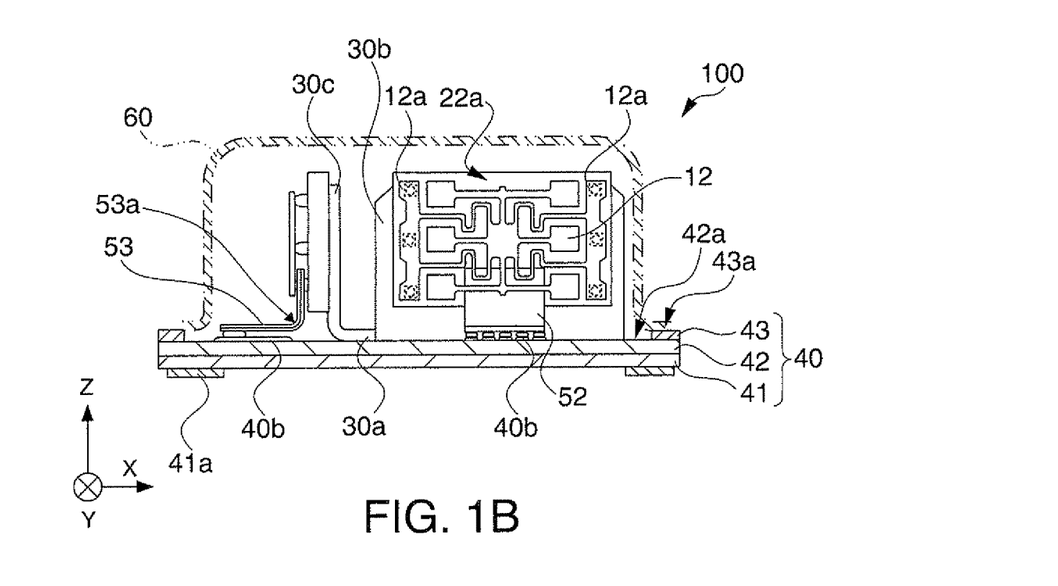

FIGS. 1A and 1B show a semiconductor device 100 in accordance with a first embodiment. FIG. 1A and FIG. 1B are, respectively, a plan view and a cross-sectional view of the semiconductor device 100. For convenience in description, a cap 60 is not illustrated in FIG. 1A, and the cap 60 is shown by a phantom line (two-dot and dash lines) in FIG. 1B.

FIG. 1A shows an electronic component 100 that is a semiconductor device in accordance with an embodiment of the invention (hereafter referred to as a semiconductor device 100). The semiconductor device 100 equipped with gyro oscillation elements 11, 12 and 13 will be described as an example of the embodiment. The gyro oscillation elements 11, 12 and 13 are affixed on semiconductor chips 21, 22 and 23 (hereafter referred to as semiconductor elements 21, 22 and 23) which respectively define second substrates. The semiconductor elements 21, 22 and 23 have active surfaces 21a, 22a and 23a on which a plurality of connection pads 21c, 22c and 23c are provided, respectively, which are bonded to electrode wires (not shown) provided on support sections 11a, 12a and 13a of the gyro oscillation elements 11, 12 and 13, respectively. For convenience in drawing, the support section 13a of the gyro oscillation element 13 is not illustrated.

In the semiconductor device 100, surfaces 11b, 12b and 13b of the gyro oscillation elements 11, 12 and 13 are each arranged to be orthogonal to X, Y and Z axes, as shown in the figures, such that each of the gyro oscillation elements 11, 12 and 13 functions as a 3-axis gyro sensor. The semiconductor elements 21, 22 and 23 equipped with the gyro oscillation elements 11, 12 and 13 are affixed to element fixing sections provided on an element fixing plate 30, which will be shown in detail in FIGS. 2A and 2B, by an appropriate method, such as, bonding with adhesive. According to the present example, the element fixing plate 30 is affixed at one surface of the element fixing section 30a of the element fixing plate 30 to a package substrate 40 that defines a third substrate.

The semiconductor elements 21, 22 and 23 affixed to the package substrate 40 through the element fixing plate 30 are electrically connected to external connection terminals 21b, 22b and 23b formed on the active surfaces 21a, 22a and 23a of the semiconductor elements 21, 22 and 23 through FPCs 51, 52 and 53 that define first wiring substrates, and to electrodes 40a, 40b and 40c formed on a loading surface 42a (hereafter referred to as a mounting surface 42a) of the package substrate 40.

The package substrate 40 is formed by laminating the second substrate, a first substrate 41 and a third substrate 43. The second substrate has a mounting surface 42a that is provided with the electrodes 40a, 40b and 40c formed thereon and on which the element fixing plate 30 equipped with the semiconductor elements 21, 22 and 23 is mounted. The first substrate 41 is equipped with external electrodes 41a connected to the electrodes 40a, 40b and 40c through internal wiring (not shown). The third substrate 43 has a sealing surface 43a for sealing and fixing the cap 60 that seals the inner portion.

As shown in FIG. 1A, the active surfaces 22a and 23a of the semiconductor elements 22 and 23 are mounted on the package substrate 40 at about 90 degrees with respect to the mounting surface 42a, i.e., in a vertical mounting mode. Accordingly, the FPC 53 is formed with a bent section 53a, thereby electrically connecting the semiconductor element 23 to the package substrate 40. Although not shown in FIG. 1, the FPC 52 is also formed with a bent section, like the FPC 53, thereby electrically connecting the semiconductor element 22 and the package substrate 40.

Figure 3A:
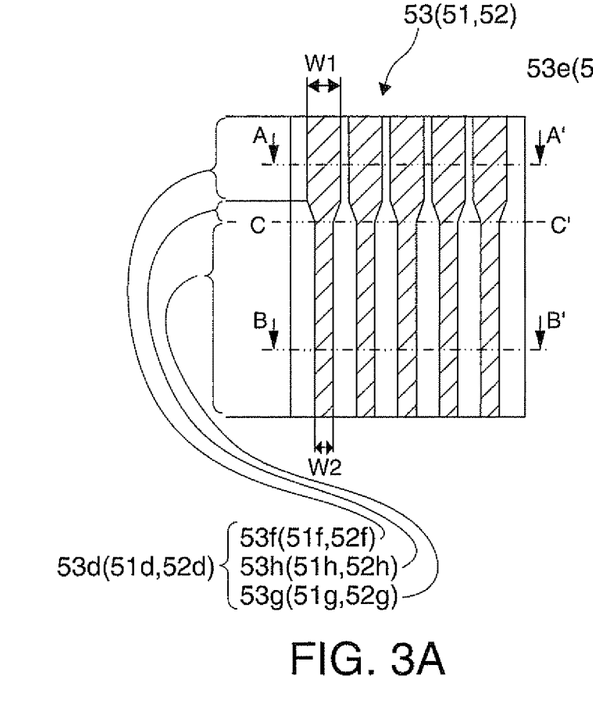
FIG. 3A is a plan view of a FPC in accordance with the first embodiment.
Figure 3B:
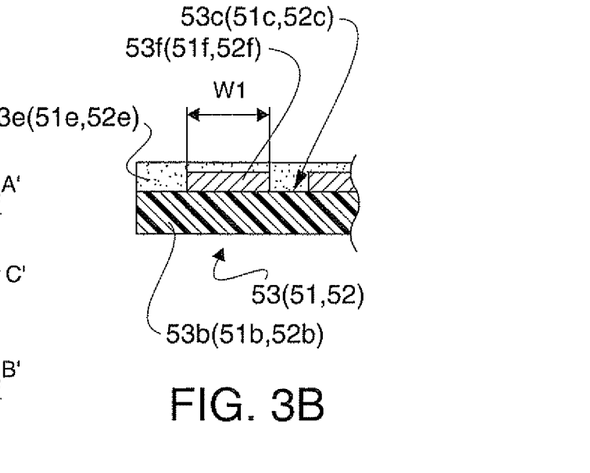
FIGS. 3B and 3C are cross-sectional views of the FPC.
Figure 3C:
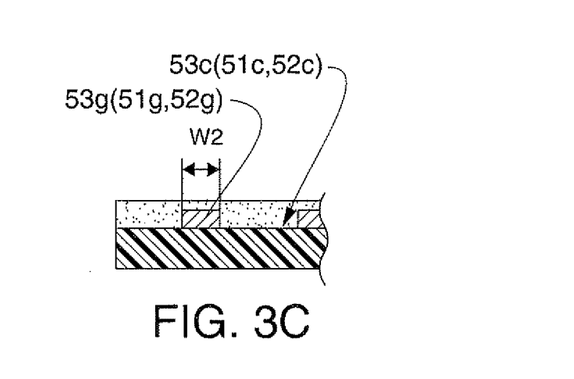

The FPCs 51, 52 and 53 will be described. FIGS. 3A, 3B and 3C show the FPCs 51, 52 and 53. FIG. 3A is a plan view, FIG. 3B is a cross-sectional view taken along a line A-A' of FIG. 3A, and FIG. 3C is a cross-sectional view taken along a line B-B' of FIG. 3A. The FPCs 51, 52 and 53 have generally the same configuration, and therefore only the FPC 53 is described as an example.

The FPC 53 includes a FPC substrate 53 that defines a first substrate having a wiring forming surface 53c that defines a first surface, and a plurality of conductive wires 53d formed on the wiring forming surface 53c. Further, a dielectric film or a coating 53e may be formed to cover the conductive wires 53d except the bonding portion between the semiconductor element 23 and the package substrate 40. The FPC substrate 53b may be formed from a film of synthetic resin. As the synthetic resin material, any known material, such as, polyimide may preferably be used. The conductive wires 53d may preferably be formed from conductive metal with excellent ductility, such as, for example, copper, aluminum, gold or the like.

Figures 3D, 3E:
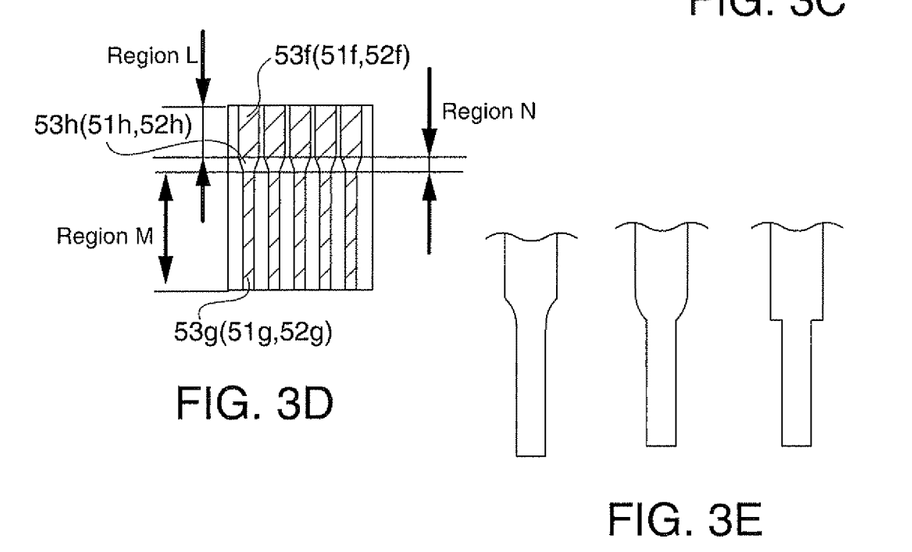
FIG. 3D is a schematic view for explaining regions of the FPC.
FIG. 3E shows examples of conductive wires of the FPC with different line widths.

In the FPC 53, the line width W2 of each of the conductive wires 53g at the section B-B' is formed to be narrower than the line width W1 of each of the conductive wires 53f at the A-A' section shown in FIG. 3A. As shown in FIG. 3D, let us define a region of the FPC 53 where the conductive wires 53f are formed as a region L that is a first region or a first portion, and a region where the conductive wires 53g are formed as a region M that is a second region or a second portion. Also, a region where conductive wires 53h whose width continuously changes to connect the conductive wires 53f and the conductive wires 53g having different line widths is defined as a region N that is a third portion.

The conductive wires 53f formed in the region L are electrically connected and bonded to the external connection terminals 23b formed on the active surface 23a of the semiconductor element 23 shown in FIGS. 1A and 1B, at their end sides on the opposite side of the region M. Also, the conductive wires 53g formed in the region M are electrically connected and bonded to the electrodes 40b formed on the mounting surface 42a of the package substrate 40 on their end sides on the opposite side of the region L. As shown in FIG. 1B, in a configuration in which the semiconductor element 23 and the package substrate 40 are connected to each other by the FPC 53 being bent in a middle section of the FPC 53, the FPC 53 is bent near a line C-C' shown in FIG. 3A that is a border between the conductive wires 53g in the region M where the line width is narrow and the conductive wires 53h whose line width is changed.

In other words, the conductive wires 53h that change the line width W2 of the conductive wires 53g to the line width W1 of the conductive wires 53f define a line width changing point, and the conductive wires 53d made of metal have large bending strength compared to polyimide that forms the FPC substrate 53b, such that the FPC 53 bents around the C-C' portion as a bent section where it becomes more difficult to bend.

FIG. 3E shows other examples of the conductive wires 53h whose line width changes, which are mutually different in the manner how the line width changes. As shown in FIG. 3E, the line width of the conductive wire 53h may be formed with a curve shown on the left in the figure, that is, a concave configuration toward the inner side of the line width, or with a curve shown in the center in the figure, that is, a convex configuration toward the outer side of the line width. Also, it is possible to use a configuration in which the conductive wire 53f and the conductive wire 53g are directly joined together without the conductive wire 53h provided there between, as shown on the right in FIG. 3E.

The FPC 53 described above has, as an example, a configuration in which the line width W2 of the conductive wires 53g in the region M is smaller, compared to the line width W1 of the conductive wires 53f in the region L. However, the invention is not limited to this configuration. For example, when the region L of the FPC 53 has an area $S_L$ in a plan view, the conductive wire 53f has an area $S_l$ in a plan view, the region M has an area $S_M$ in a plan view, and the conductive wire 53g has an area $S_m$ in a plan view, the following relation may be established:

$$(S_m/S_M)/(S_l/S_L)<1.0$$

In other words, the conductive wires 53d may be formed in a configuration in which the forming area ratio of the conductive wires 53g in the region M is smaller than the forming area ratio of the conductive wires 53f in the region L.

Figure 4A:
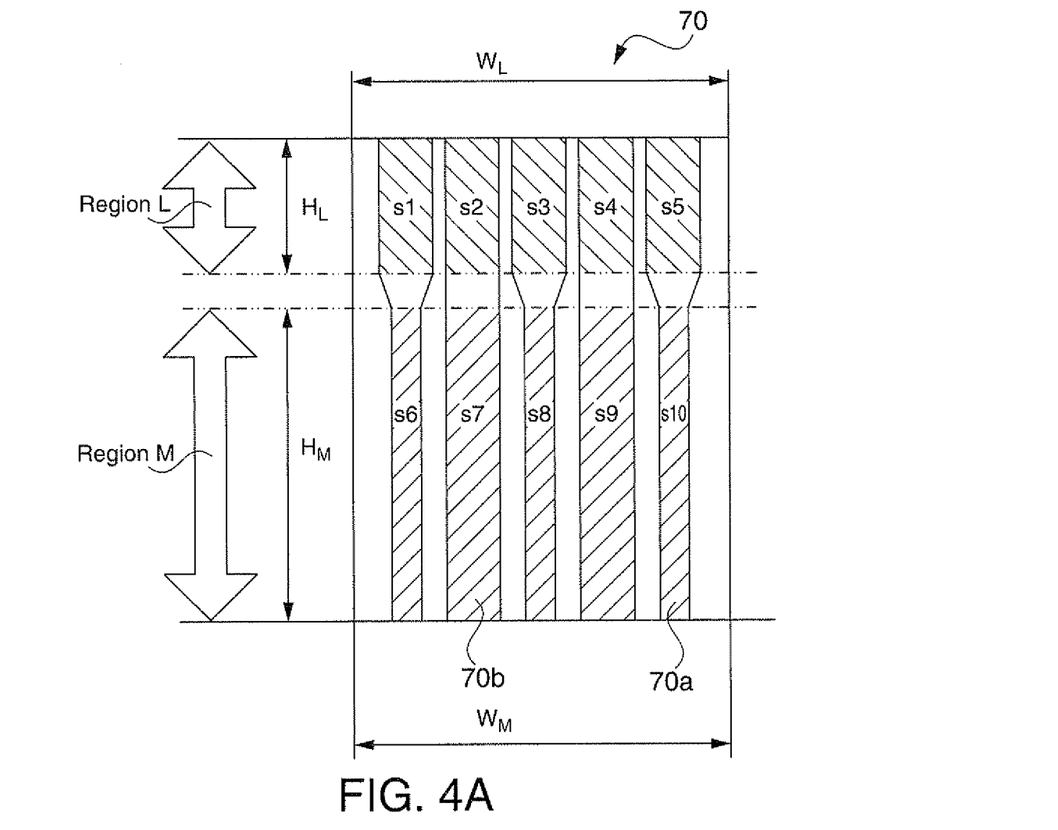
FIGS. 4A and 4B are plan views of other examples of FPCs in accordance with the first embodiment.

For example, FIG. 4A shows a FPC 70 including conductive wires 70a having different line widths in the regions L and M, and conductive wires 70b having the same line width in the regions L and M, which are mixed together. In the region L, the area $S_L$ of the region L is given by:

$$S_L = H_L \times W_L$$

The area $S_l$ of the conductive wires 70a and 70b in the region L in a plan view is the sum of areas s1-s5 of the conductive wires 70a and the conductive wires 70b in the region L, which is given by:

$$S_l = s1+s2+s3+s4+s5$$

Meanwhile, the area $S_M$ of the region M is given by:

$$S_M = H_M \times W_M$$

The area $S_m$ of the conductive wires 70a and 70b in the region M in a plan view is the sum of areas s6-s10 of the conductive wires 70a and the conductive wires 70b in the region M, which is given by $$S_m = s6+s7+s8+s9+s10$$

The line widths of the conductive wires 70a and 70b are to be decided such that the values $S_m$, $S_M$, $S_l$ and $S_L$ thus obtained satisfy the following relation:

$$(S_m/S_m)/(S_l/S_L)<1.0$$

Figure 4B:
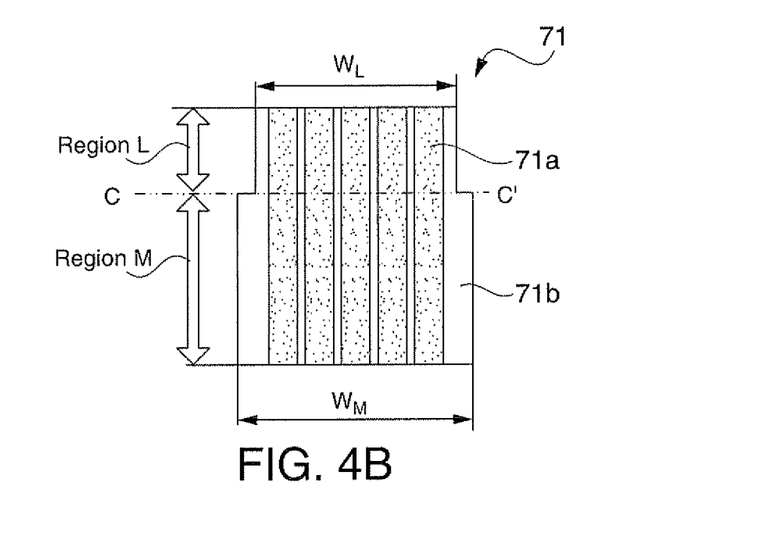

Also, FIG. 4B shows a FPC 71 including conductive wires 71a having the same line width. Even in this case, its FPC substrate 71b can be formed to have a width $W_L$ in the region L and a with $W_M$ greater than the width $W_L$ in the region M, whereby the aforementioned relation, $(S_m/S_M)/(S_l/S_L)<1.0$ can be satisfied.

Second Embodiment

Figure 5:
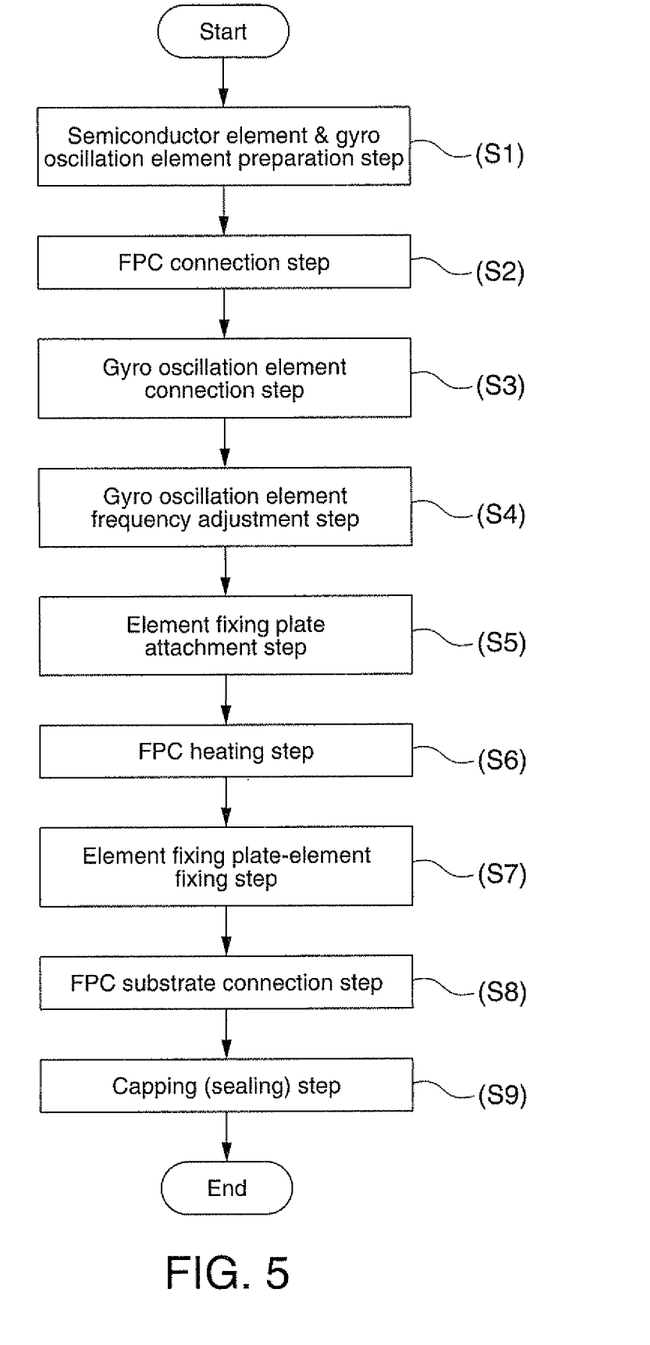
FIG. 5 is a flow chart of a method for manufacturing a semiconductor device in accordance with a second embodiment.

As a second embodiment, a method for manufacturing the semiconductor device 100 in accordance with the first embodiment described above will be described. FIG. 5 is a flow chart showing steps of manufacturing the semiconductor device 100 of the first embodiment.

First, semiconductor elements 21, 22 and 23, and gyro oscillation elements 11, 12 and 13 composing the semiconductor device 100 in accordance with the first embodiment are prepared (S1). In step S1, on active surfaces 21a, 22a and 23a of the semiconductor elements 21, 22 and 23, connection pads 21c, 22c and 23c for connecting to the gyro oscillation elements 11, 12 and 13, and external connection terminals 21b, 22b and 23b for connecting to the FPC 51, 52 and 53 are formed in the shape of bumps (in the shape of protrusions) by, for example, stud bumps or paste. The gyro oscillation element 11, 12 and 13 are formed from, for example, crystal quartz, and equipped with predetermined electrode wires.

As shown in FIGS. 3A and 3B, each of the FPCs (51, 52 and 53) is provided with conductive wires (51d, 52d and 53d)

including conductive wires (51f, 52f and 53f) that define first metal wires formed in the region L defining the first region corresponding to the external connection terminals (21b, 22b and 23b) provided on the semiconductor element (21, 22 and 23), and conductive wires (51g, 52g and 53g) that define second metal wires formed in the region M defining the second region corresponding to the electrodes (40a, 40b and 40c) of the package substrate 40.

Figure 6A:
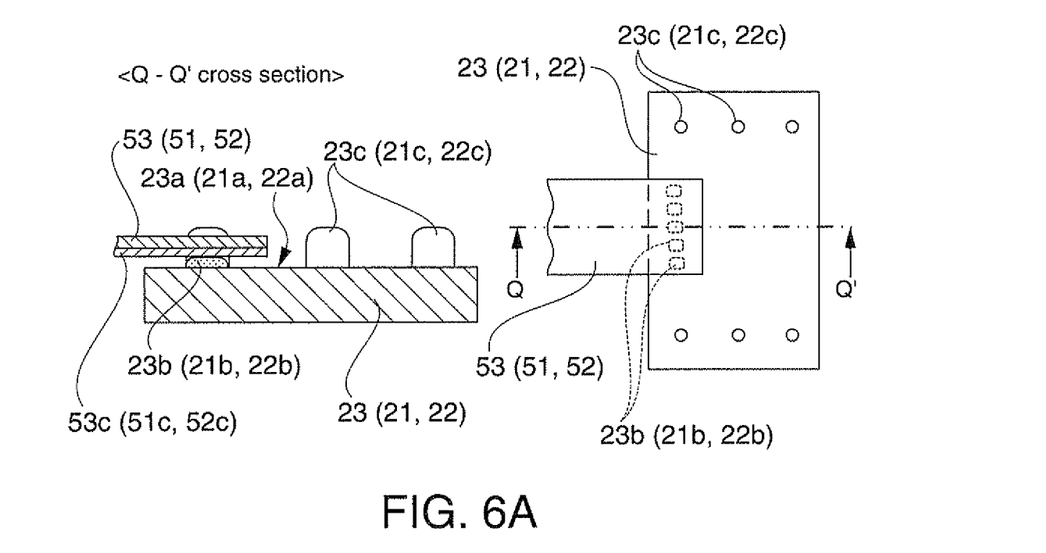
FIGS. 6A and 6B each show, in a cross-sectional view and a plan view, the method for manufacturing a semiconductor device in accordance with the second embodiment.

Next, a FPC connection step (S2) is conducted. In the FPC connection step (S2), the FPCs 51, 52 and 53 are processed by the same method, and therefore this step is described using the FPC 53 as an example. In the FPC connection step (S2), as shown in FIG. 6A, the external connection terminals 23b formed on the active surface 23a of the semiconductor element 23 and the conductive wires 53f of the FPC 53 in the region L are aligned with each other, and bonded together by ultrasonic bonding. The bonding method is not limited to ultrasonic bonding, and any one of appropriate bonding methods may be selected.

Figure 6B:
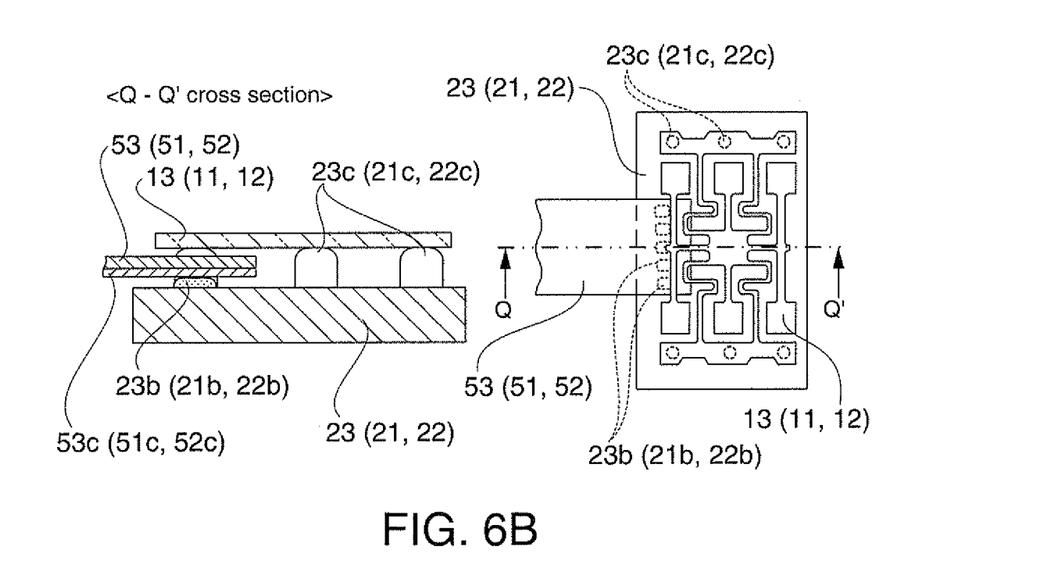

Next, a gyro oscillation element connection step (S3) is conducted. In the step S3, gyro oscillation elements 11, 12 and 13 are mounted on the semiconductor elements 21, 22 and 23 bonded to the FPCs 51, 52 and 53, respectively. It is noted that, in the gyro oscillation element connection step (S3), the gyro oscillation elements 11, 12 and 13 are processed by the same method, and therefore this step is described using the gyro oscillation element 13 as an example. As shown in FIG. 6B, in the gyro oscillation element connection step (S3), an electrode section (not shown) (which is provided opposite the connection pad 23c) of the support section 13a of the gyro oscillation element 13 is electrically connected and fixedly bonded to the connection pad 23c formed on the active surface 23a of the semiconductor element 23 by conductive adhesive. Alternatively, the connection pad 23c and the support section 13a may be electrically connected together by application of heat and pressure. Also, at the time of heat application, heating may be conducted in a manner that heat transfers to the FPC 53. The bonding is not limited to the method using conductive adhesive, and any one of appropriate bonding methods may be used.

Next, a gyro oscillation element frequency adjustment step (S4) is conducted. In the gyro oscillation element frequency adjustment step (S4), a laser beam is irradiated on electrode films or metal films for adjustment formed on the driving arms of each of the gyro oscillation elements 11, 12 and 13, thereby partially removing the metal films to adjust the oscillation frequency of each of the gyro oscillation elements 11, 12 and 13 to a predetermined frequency.

Figure 2A:
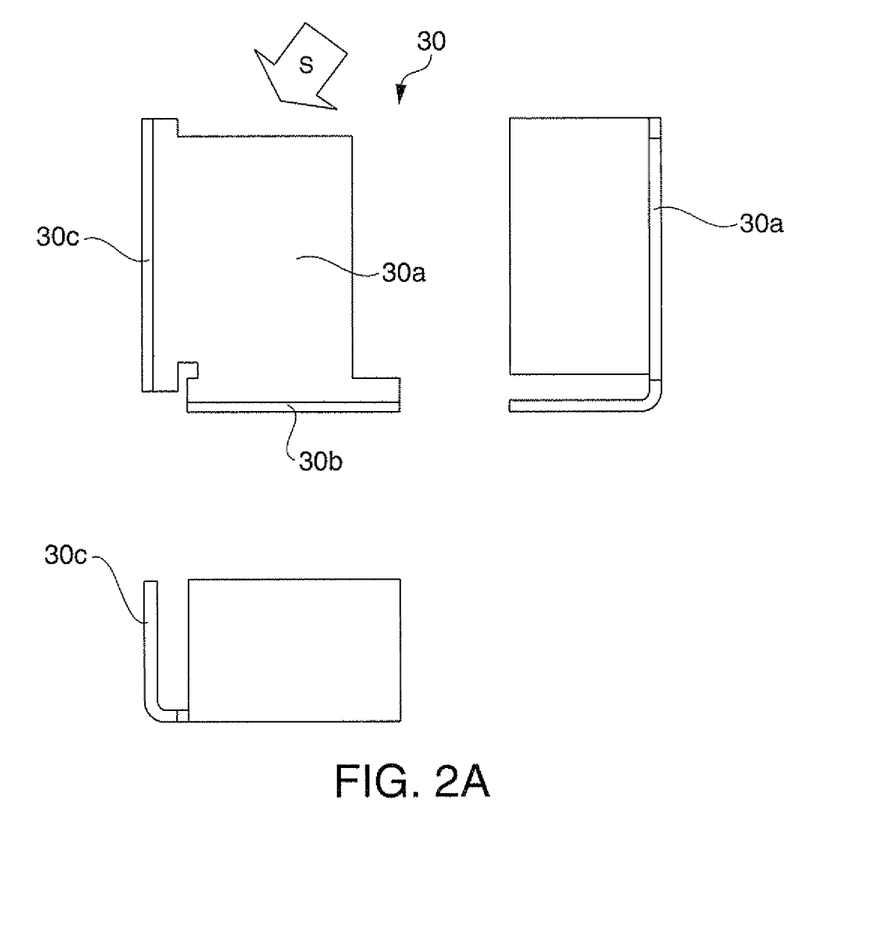
FIG. 2A shows a plan view, a side view and a bottom plan view of an element fixing plate of the semiconductor device in accordance with the first embodiment.
Figure 2B:
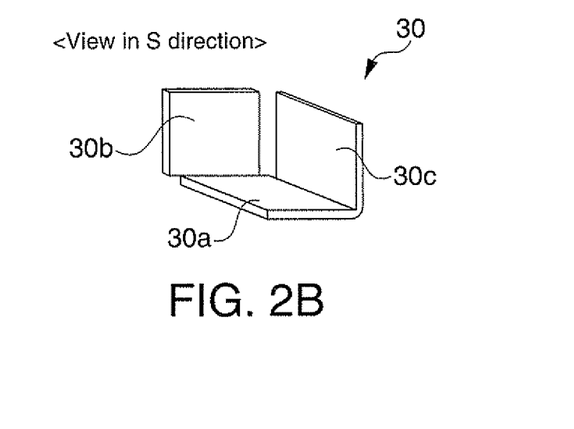
FIG. 2B is a perspective view of the element fixing plate.
Figures 7A, 7B:
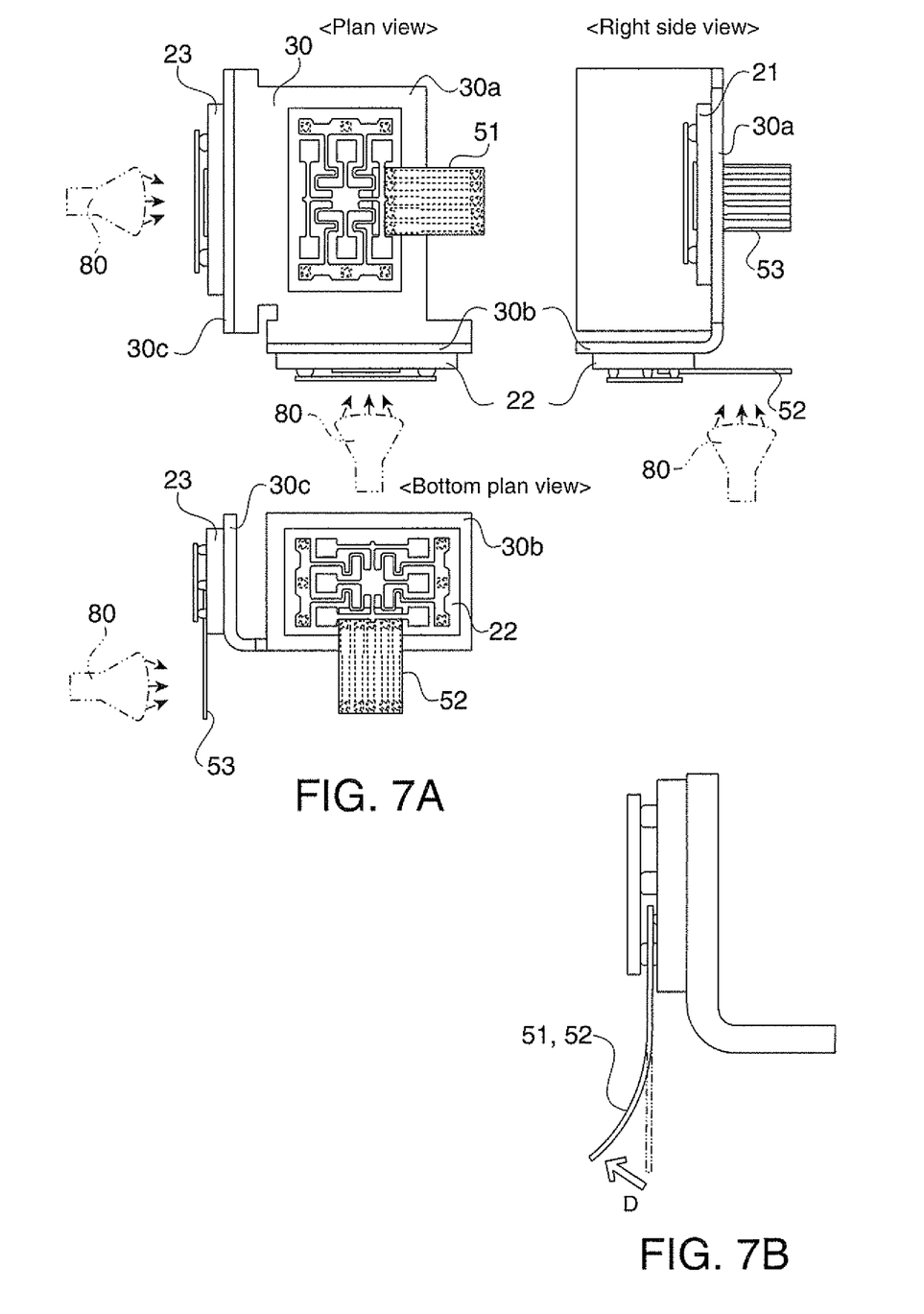
FIG. 7A shows, in a plan view, a side view and a bottom plan view, the method for manufacturing a semiconductor device in accordance with the second embodiment.
FIG. 7B shows the method in a cross-sectional view.

Next, an element fixing plate attachment step (S5) is conducted. In the element fixing plate adhesion step (S5), an element fixing plate 30 shown in FIGS. 2A and 2B is prepared in advance. The element fixing plate 30 is formed using a plate member made of, for example, stainless steel, brass, aluminum or the like. As shown in FIG. 7A, the semiconductor elements 21, 22 and 23 which have been processed up to the step S4 are attached to the element fixing plate 30.

The semiconductor elements 21, 22 and 23 may be attached to the element fixing plate, using adhesive. Any type of adhesive may be used without any particular limitation, and adhesive with excellent bonding and insulation property, such as, for example, epoxy based adhesive may preferably be used. In the present example shown, the semiconductor element 21 is affixed with adhesive to the element fixing section 30a that is affixed with adhesive to the mounting surface 42a of the package substrate 40. However, after the element fixing plate 30 may be first affixed to the package substrate 40 to be discussed later, and then the semiconductor element 21 may be bonded to the element fixing section 30a.

Next, a FPC heating step (S6) is conducted. In the FPC heating step (S6), the FPCs 52 and 53 are heated to form slight bent sections in advance in the FPC 52 and 53 that will be bent when they are assembled onto the package substrate 40. The FPCs 52 and 53 may be heated by any appropriate heating method using, for example, hot air, a halogen lamp, solid state heater contact or the like. In order to avoid unnecessary heat load to be applied to the semiconductor elements 22 and 23, and the semiconductor element 21 equipped with the FPC 51 that is not bent, heating with a halogen lamp that can collect and irradiate heat or heating by contact with a solid state heater is suitable.

As shown in FIG. 7A, halogen heaters 80 each equipped with a heat collector device may be disposed opposite the FPCs 52 and 53, and the FPCs 52 and 53 are retained and heated at 150° C.-200° C. for 1-2 minutes. By heating in this manner, deformation is generated in the FPCs 52 and 53 in a direction indicated by an arrow D as shown in FIG. 7B.

Figure 8A:
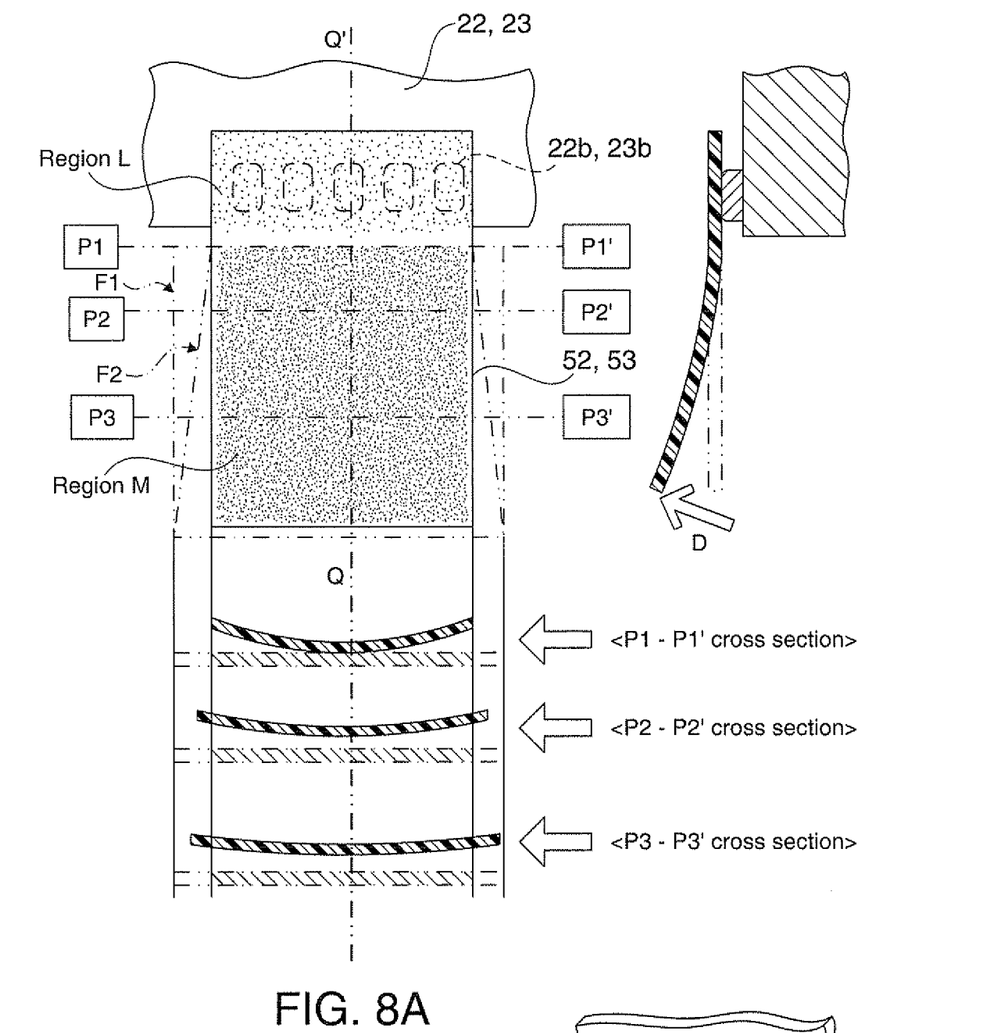
FIGS. 8A and 8B are conceptual illustrations for explaining deformation of a FPC in the method for manufacturing a semiconductor device in accordance with the second embodiment.
Figure 8B:
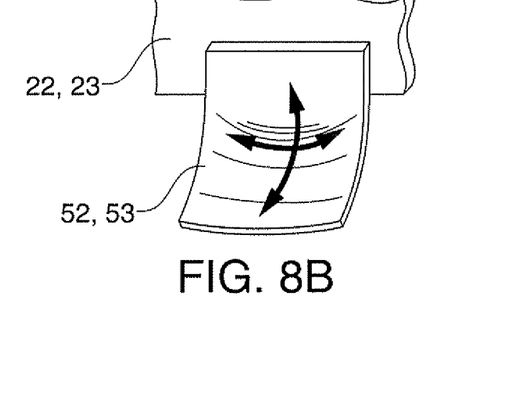

The deformation in the direction D caused by heat is generated due to thermal expansion of polyimide that is the material of the FPC substrates 51b, 52b and 53b of the FPCs 51, 52 and 53. FIGS. 8A and 8B are schematic illustrations for explaining the phenomenon in which thermal deformation is generated in the FPC heating step (S6). As shown in a schematic plan view in FIG. 8A, the FPCs 52 and 53 are fixedly bonded to the external connection terminals 22b and 23b of the semiconductor elements 22 and 23. In other words, the regions L of the FPCs 52 and 53 are in effect fixedly bonded to the semiconductor elements 22 and 23.

Moreover, as described above, in the region L of the FPCs 52 and 53, the line width of the conductive wires 52f and 53f, or the area ratio of the conductive wires 52f and 53f occupying the region L is large, as shown in FIG. 3A, and the thermal expansion of the metal conductive wires 52f and 53f is smaller, compared to polyimide forming the FPC substrates 52b and 53b, such that thermal expansion of the FPCs 52 and 53 in the region L is restricted.

In contrast, in the region M of the FPCs 52 and 53, the line width of the conductive wires 52g and 53g, or the area ratio thereof is small, such that polyimide of the FPC substrates 52b and 53b thermally expands, and would expand to a shape F1 after expansion as indicated in FIG. 8A. However, as the thermal expansion of the FPCs 52 and 53 in the region L is restricted, as described above, the thermal expansion of the region M is brought into a state in which its shape is restricted to a shape F2. In this instance, at a section P1-P1' of the region M near the region L, the FPCs 52 and 53 warp as shown in a cross-sectional view taken along P1-P1' of FIG. 8A in order to absorb an increase in the width of the FPCs 52 and 53 caused by the thermal expansion, because the FPCs 52 and 53 before thermal expansion are influenced by the restriction of the thermal expansion in the region L. The influence of the restriction of thermal expansion in the region L gradually diminishes to a farther section P2-P2' and to an even farther section P3-P3', and the degree of warping of the FPCs 52 and 53 becomes smaller accordingly.

On the other hand, along a section Q-Q' shown in FIG. 8A, as shown in a cross-sectional view taken along Q-Q', the warping in the cross section P1-P1' generated by the influence of the restriction of thermal expansion in the region L causes a warping in a direction D shown in the figure. This causes warping in two directions, as shown in a perspective view in FIG. 8B. It is noted that the FPCs are heated by using the halogen heaters 80 in the FPC heating step (S6), but instead, the bent sections described above may be formed in the FPCs by heat applied to the FPCs in the gyro oscillation element connection step (S3).

Figure 9A:
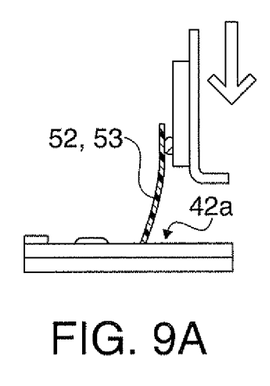
FIGS. 9A, 9B and 9C show, in cross sections, the method for manufacturing a semiconductor device in accordance with the second embodiment.
Figure 9B:
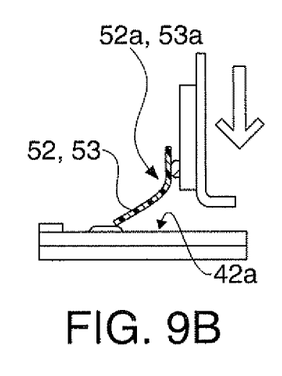
Figure 9C:
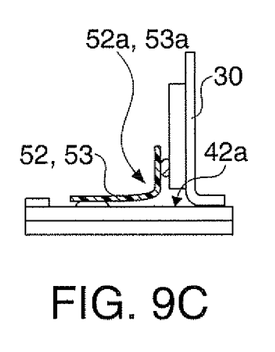

Next, an element fixing plate-substrate fixing step (S7) is conducted. In the element fixing plate-substrate fixing step (S7), the element fixing plate 30 to which the semiconductor elements 21, 22 and 23 have been affixed in the steps S5 and S6 is mounted on the package substrate 40. First, the element fixing plate 30 with the semiconductor elements 21, 22 and 23 affixed thereto is mounted on the package substrate 40. In this process, the FPCs 52 and 53 that have been warped in the step S6 are brought in contact at their tips to the mounting surface 42a of the package substrate 40, as shown in FIG. 9A. Then, as shown in FIG. 9B, the tip sections of the FPCs 52 and 53 gradually move along the mounting surface 42a, while, at the same time, the bent sections 52a and 53a gradually bend further at the C-C' section shown in FIG. 3A. Then, the element fixing plate 30 is mounted in a predetermined assembly position, as shown in FIG. 9C. Then, the mounting surface 42a and the element fixing plate 30 are bonded together by adhesive or the like.

In this manner, by forming the warped sections in the FPCs 52 and 53 in the region M by heat application in the FPC heating step (S6), the predetermined bent sections 52a and 53 can be automatically formed in the FPCs 52 and 53 concurrently with the mounting work in the step of fixing the element fixing plate to the substrate (S7).

The bent sections 52a and 53a start bending around the C-C' section as a bending start point which defines a boundary between the conductive wires 52g (53g) in the region M and the conductive wires 52h (53h) in the region N shown in FIG. 3A. In other words, as the conductive wires 52h (53h) in the region N where the line width becomes greater are more difficult to bend, the portions along the C-C' section at the boundary would more readily bend. Therefore, the position of the C-C' section that defines the boundary between the conductive wires 52g (53g) in the region M and the conductive wires 52h (53h) in the region N may be decided in advance, whereby the bending positions in the FPCs 52 and 53 can be controlled.

Figure 10:
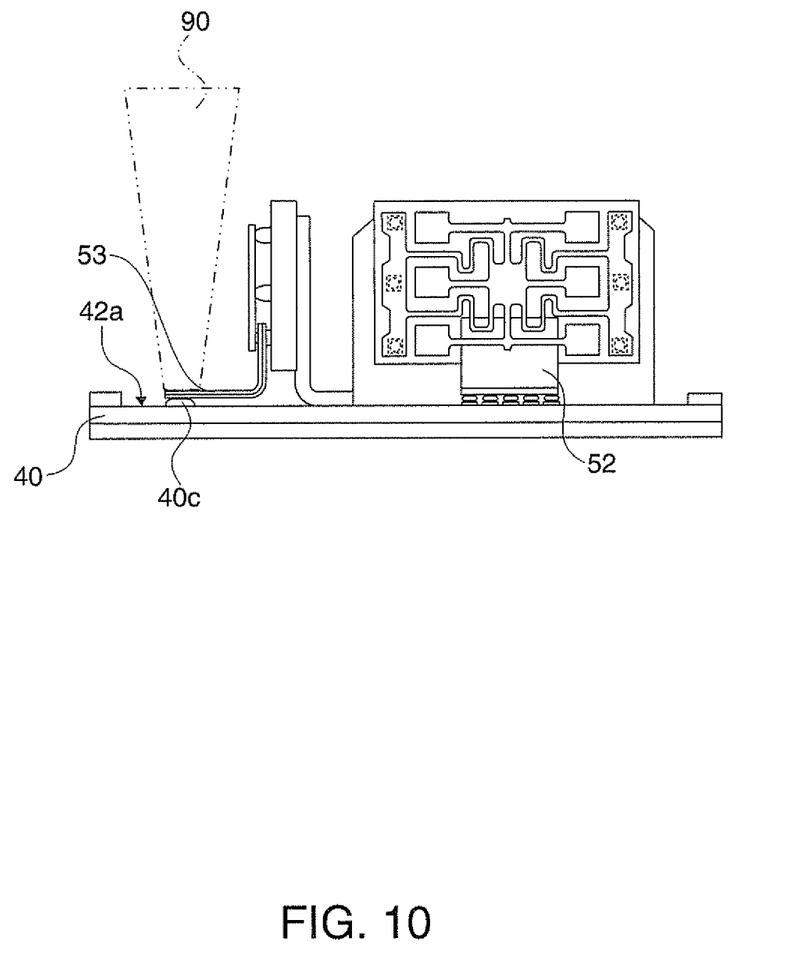
FIG. 10 shows, in a cross-sectional view, the method for manufacturing a semiconductor device in accordance with the second embodiment.

Next, a FPC-substrate connection step (S8) is conducted. In the FPC-substrate connection step (S8), as shown in FIG. 10, one end sections of the FPCs 51, 52 and 53 are electrically connected to the electrodes 40a formed on the mounting surface 42a of the package substrate 40. For the connection, for example, in the case of the FPC 53 shown in the figure, the tip of an ultrasonic cone 90 may be abutted to the connection section in a manner to push the FPC 53 against the electrode 40c, and the FPC 53 and the electrode 40c are connected by ultrasonic bonding. By using the same method, the FPCs 51 and 52 are connected to the package substrate 40. It is noted that the connection may be conducted individually for each of the FPCs 51, 52 and 53. Alternatively, a plurality of ultrasonic cones may be used to connect them at the same time.

Next, a capping (sealing) step (S9) is conducted. In the capping (sealing) step (S9), as the semiconductor device 100 shown in the present example is equipped with the gyro oscillation elements 11, 12 and 13, a cap 60 shown in FIG. 1B is fixedly bonded to the upper surface of the third substrate 43 of the package substrate 40, in order to remove oxygen gas and nitrogen gas in the air which are gas compositions around the elements which make vibration of the gyro oscillation elements 11, 12 and 13 unstable, and maintain the interior of the semiconductor device 100 vacuum sealed. The cap 60 may be made of metal, such as, for example, stainless steel, titanium, titanium alloy, aluminum, aluminum alloy or the like. The cap 60 is placed on the package substrate 40, and the cap 60 and the third substrate 43 are sealed and affixed together in a vacuum (a reduced pressure) atmosphere, thereby completing the semiconductor device 10 shown in FIG. 1.

When the semiconductor elements 22 and 23 that define the second substrates are mounted on the package substrate 40 that defines the third substrate in orientations nonparallel to one another, for example, as in the present example, angled at about 90 degrees with one another, the FPCs 52 and 53 that define the first wiring substrates for connecting the semiconductor elements 22 and 23 with the package substrate 40 need to be provided with bent sections. As described above, the following method is conducted for forming the bent sections. The FPCs 52 and 53 are heated to form warped sections; in the process of mounting the semiconductor elements 22 and 23 together with the element fixing plate 30, the tip sections of the FPCs 52 and 53 with the warped sections formed therein are slidably moved along the mounting surface 42a of the package substrate 40; at the time when the element fixing plate is mounted on the mounting surface 42a, the FPCs 52 and 53 are each provided with the predetermined bent configuration. In other words, in any mount methods, which may be represented by the so-called vertical mount method, excluding the surface mount method, bent sections in FPCs can readily be formed, processes for mounting electronic components can be streamlined, and cost-reduction can be achieved.

It is noted that the embodiment has been described above, using a semiconductor device as an example. However, without any particular limitation to the above, the FPC connection method in accordance with the invention is applicable even when electronic components other than semiconductor elements are mounted on a substrate nonparallel to one another.

Embodiment Examples

Figure 11A:
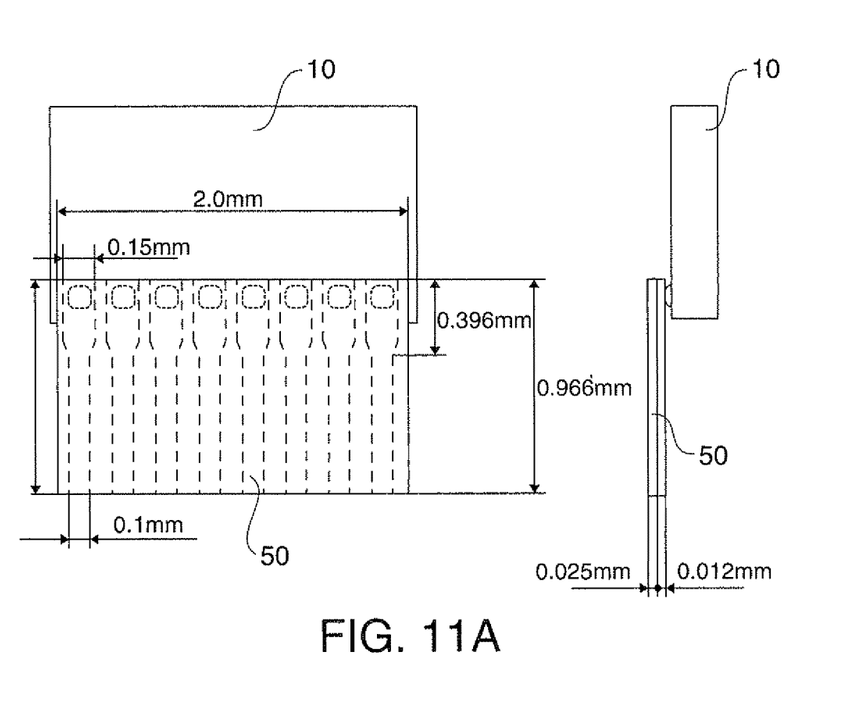
FIGS. 11A, 11B and 11C are a plan view and cross-sectional views of embodiment examples.
Figure 11B:
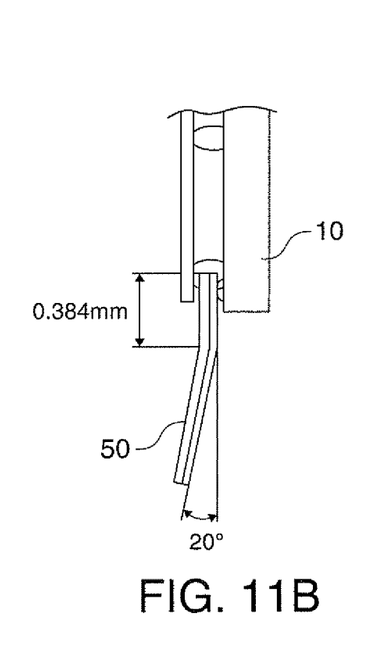
Figure 11C:
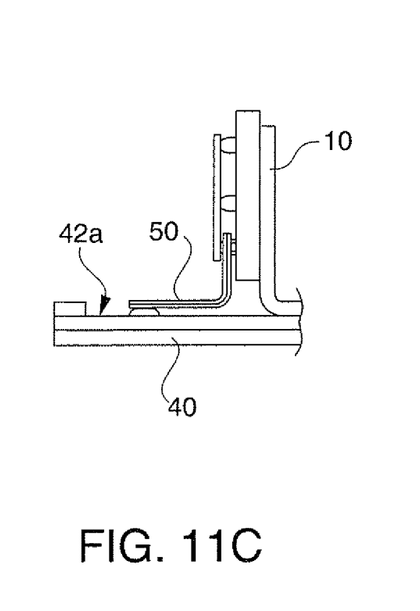

A semiconductor element 10 and a FPC 50 fixedly bonded to the semiconductor element 10 having dimensions as shown in FIG. 11A were prepared, and the FPC 50 was heated at 200° C. for two minutes. As a result, the FPC 50 acquired a bent at an angle of about 20 degrees as shown in FIG. 11B. The semiconductor element 10 having the FPC 50 with the bent was fixedly bonded to the element fixing plate 30, and mounted on the package substrate 40. As a result, as shown in FIG. 11C, the FPC 50 was successfully bent along the mounting surface 42a of the package substrate 40.

What is claimed is:
1. A method for connecting substrates, comprising:
preparing a first wiring substrate having a first substrate including a first surface, the first surface having a first region and a second region which are provided with a first metal wire, wherein an area ratio between the first region and the first metal wire in the first region is different from an area ratio between the second region and the first metal wire in the second region;
electrically bonding a second metal wire on a second substrate to the first metal wire provided in the first region of the first wiring substrate;
heating the first wiring substrate to bend the first wiring substrate between the first region and the second region; and
electrically connecting a third wiring located in a first surface of a third substrate to the first metal wire provided in the second region of the first wiring substrate, thereby mounting the first wiring substrate on the third substrate in a manner that a portion or the entirety of the first surface of the first substrate is nonparallel to the first surface of the third substrate.

2. A method for bonding substrates together, comprising:
preparing a first wiring substrate that a has first metal wire located in a first surface of a first substrate and including a first portion and a second portion having a narrower width than the first portion;
heating the first wiring substrate to bend the first wiring substrate between the first portion and the second portion;
electrically bonding a second metal wire on a second substrate to the first portion of the first wiring substrate; and
electrically connecting a third wire located in a first surface of a third substrate to the second portion of the first metal wire, thereby mounting the first wiring substrate on the third substrate in a manner that a portion or the entirety of the first surface of the first substrate is nonparallel to the first surface of the third substrate.

3. A method for bonding substrates together recited in claim 1, wherein the first substrate is thicker than the first metal wiring.

4. A method for bonding substrates together recited in claim 1, wherein the step of bending the first wiring substrate includes heating the first wiring substrate at temperatures between 150° C. and 250° C.

5. A method for bonding substrates together recited in claim 2, wherein the first portion and the second portion of the first metal wire are connected by a third portion that continuously narrows from the first portion toward the second portion.

6. A method for manufacturing a semiconductor device, comprising:
preparing a first wiring substrate that has a first metal wire located in a first surface of a first substrate and including a first portion and a second portion having a narrower width than the first portion;
heating the first wiring substrate to bend the first wiring substrate between the first portion and the second portion;
electrically bonding a second metal wire on a second substrate to the first portion of the first wiring substrate; and
electrically connecting a third wire located in a first surface of a third substrate to the second portion of the first metal wire, thereby mounting the first wiring substrate on the third substrate in a manner that a portion or the entirety of the first surface of the first substrate is nonparallel to the first surface of the third substrate,
the second substrate being a semiconductor chip.

7. A method for manufacturing a semiconductor device recited in claim 6, wherein the first substrate is thicker than the first metal wiring.

8. A method for manufacturing a semiconductor device recited in claim 6, wherein the step of bending the first wiring substrate includes heating the first wiring substrate at temperatures between 150° C. and 250° C.

9. A method for manufacturing a semiconductor device recited in claim 7, wherein the first portion and the second portion of the first metal wire are connected by a third portion that continuously narrows from the first portion toward the second portion.

* * * * *